United States Patent [19]

Yamamoto et al.

[11] Patent Number: 4,560,737
[45] Date of Patent: Dec. 24, 1985

[54] PIEZOELECTRIC POLYMERIC MATERIAL

[75] Inventors: Kazuhiko Yamamoto; Kazumi Nejigaki, both of Tokyo; Takashi Yasumura, Fujimi; Chikashi Kawashima; Shuichi Inoue, both of Kamifukuoka, all of Japan

[73] Assignee: Central Glass Company, Limited, Ube, Japan

[21] Appl. No.: 567,177

[22] Filed: Dec. 30, 1983

[30] Foreign Application Priority Data

Jan. 6, 1983 [JP] Japan .................................. 58-709

[51] Int. Cl.$^4$ ............................................. C08L 27/16
[52] U.S. Cl. .................................... 527/72; 264/22; 264/26; 264/288.4; 525/88
[58] Field of Search ..................... 525/72, 88, 199; 264/22

[56] References Cited

U.S. PATENT DOCUMENTS

| | | | |
|---|---|---|---|
| 3,769,371 | 10/1973 | Nersasian | 525/199 |
| 3,794,986 | 2/1974 | Murayama | 340/173 |
| 3,798,287 | 3/1974 | Murayama et al. | 525/267 |
| 4,200,568 | 4/1980 | Trautvetter | 525/199 |
| 4,393,093 | 7/1983 | Sprout, Jr. | 427/40 |

FOREIGN PATENT DOCUMENTS

| | | | |
|---|---|---|---|
| 105433 | 4/1984 | European Pat. Off. | 525/199 |
| 9030847 | 2/1984 | Japan | 525/72 |

OTHER PUBLICATIONS

Abstract of European Pat. 18-802, (4-79), Kure.

Primary Examiner—Carman J. Seccuro
Attorney, Agent, or Firm—Schwartz, Jeffery, Schwaab, Mack, Blumenthal & Evans

[57] ABSTRACT

A piezoelectric polymeric material in the form of sheet or film, which comprises polymers of vinylidene fluoride (VDF) as principle components. The piezoelectric material is essentially a mixture of 100 parts by weight of a VDF base resin, which may be either poly(VDF) or a copolymer, and 1-100 parts by weight of a copolymer of a fluoroelastomer and either VDF monomer or a monomer mixture containing a major amount of VDF monomer. A sheet or film having a high piezoelectric modulus is obtained by stretching a sheet or film of said mixture at an adequately elevated temperature and polarizing the sheet or film after or during the stretching thereby making the stretching sheet or film an electret.

10 Claims, No Drawings

PIEZOELECTRIC POLYMERIC MATERIAL

BACKGROUND OF THE INVENTION

This invention relates to a piezoelectric polymeric material in the form of sheet or film, which is a polymer mixture comprising a vinylidene fluoride base resin.

Piezoelectric materials are of wide application in various fields of technology and industry, and they have been used in various pressure-sensitive devices, ultrasonic transducers and many other kinds of transducers for the audio, medical and scientific research purposes.

Piezoelectricity is an energy-converting function known as specific to crystals that have no center of symmetry, and the piezoelectric materials now in practical use are mostly inorganic materials such as quartz and PZT (lead titan-zirconate ceramics) and very limited organic crystalline materials such as Rochelle salt. These materials are generally high in the piezoelectric moduli, but they are hard and brittle materials that cannot easily be processed into various shapes. Therefore, especially it is especially difficult to produce a thin sheet or film of a conventional piezoelectric material with large widths.

Meanwhile, it has been discovered that some kinds of polymeric materials including some natural polymers such as collagen and cellulose and some synthetic polymers typified by poly(vinylidene fluoride) and poly($\gamma$-methyl-L-glutamate) exhibit piezoelectricity when films of such polymers are subjected to a DC electric field treatment in a stretched and heated state and then cooled while the electric field is maintained. Presently it is common knowledge that, among the hitherto investigated synthetic polymers, poly(vinylidene fluoride) in the form of a stretched film exhibits the highest modulus of piezoelectricity. However, even the piezoelectric modulus ($d_{31}$) of poly(vinylidene fluoride) in the form of a stretched film is about $5 \times 10^{-7}$ cgs-esu at the most. Therefore, great restrictions are placed on the practical use of poly(vinylidene fluoride) as a piezoelectric material.

SUMMARY OF THE INVENTION

It is an object of the present invention to provide an improved piezoelectric polymeric material in the form of sheet or film, which exhibits higher moduli of piezoelectricity than the films of poly(vinylidene fluoride).

To accomplish this object, the present invention provides a piezoelectric polymeric material, which is essentially a mixture comprising 100 parts by weight of a vinylidene fluoride base resin and 1-100 parts by weight of a copolymer of a first component which is a fluoroelastomer and a second component at least 50% by weight of which is vinylidene fluoride monomer, and which is produced by stretching a sheet or film of the aforementioned mixture at a temperature below the melting temperature of the mixture and polarizing the same sheet or film after commencement of the stretching thereby making the stretched sheet or film an electret.

As the basis of this invention, we have discovered that a resin composition which is obtained by mixing a vinylidene fluoride resin, as defined hereinafter, with another resin or copolymer having a rubber-like structure in such a proportion that the crystalline particles in the resultant resin composition becomes very small and well dispersed exhibits a surprisingly high modulus of piezoelectricity compared with a homopolymer of vinylidene fluoride and conventional copolymers of vinylidene fluoride with another kind of monomer.

The vinylidene fluoride base resin used as the major ingredient of the piezoelectric material of the invention may be either a homopolymer of vinylidene fluoride (VDF), i.e. poly(vinylidene fluoride) (PVDF), or a copolymer of VDF with another kind of monomer or a plurality of different kinds of monomers. In the case of a copolymer it is preferred that the amount of VDF is more than 50%. Vinyl fluoride, trifluoroethylene, tetrafluoroethylene, hexafluoropropylene and hexafluorobutene can be named as typical but nonlimitative examples of monomers which are readily copolymerizable with VDF.

The fluoroelastomer component of the copolymer mixed with the vinylidene fluoride base resin can be selected from various fluorine-containing rubber-like copolymers such as, for example, copolymers of VDF and hexafluoropropylene (HFP), ternary copolymers of VDF, HFP and tetrafluoroethylene (TFE), copolymers of VDF and chlorotrifluoroethylene (CTFE), copolymers of TFE and propylene, copolymers of TFE and a fluorine-containing vinyl ether and copolymers of a hydrocarbon diene compound and a fluorine-containing hydrocarbon monomer. A copolymer selected as the fluoroelastomer component is further copolymerized with a monomer which is either pure VDF monomer or a mixture of at least two kinds of monomers in which VDF monomer amounts to at least 50%. The copolymerization reaction at this stage may be either graft copolymerization or block copolymerization. The fluoroelastomer is copolymerized with VDF or a VDF-containing mixture in order that the resultant copolymer and the above described vinylidene fluoride base resin may be soluble in each other, and it is desirable that the proportion of VDF to the fluoroelastomer is relatively small insofar as the mutual solubility of the resultant copolymer and the VDF base resin reaches an adequate level. It is preferred to use at least 1 part by weight of VDF per 100 parts by weight of the fluoroelastomer because when the amount of VDF is smaller it is difficult to afford an improved piezoelectric modulus to a mixture of the resultant copolymer and a vinylidene fluoride base resin by reason of poor solubility of the mixed two materials in each other. However, usually it is unnecessary to use more than 100 parts by weight of VDF per 100 parts by weight of the fluoroelastomer.

According to the invention a piezoelectric material is prepared by mixing 100 parts by weight of a vinylidene fluoride base resin, as defined above, with 1-100 parts by weight of a copolymer of a fluoroelastomer and VDF or a VDF-containing copolymer. If the amount of the fluoroelastomer base copolymer is less than 1 part by weight the piezoelectric property of the vinylidene fluoride base resin can hardly be improved. However, when the amount of the fluoroelastomer base copolymer exceeds 100 parts by weight it becomes difficult to afford a desirably high piezoelectric modulus to a film of the mixture. Preferably 1-70 parts by weight of the fluoroelastomer base copolymer is mixed with 100 parts by weight of the vinylidene fluoride base resin.

Polymeric materials according to the invention have higher piezoelectric moduli than conventional PVDF films and retain good properties as polymer films. Accordingly the piezoelectric materials of the invention are of great use for piezoelectric elements or devices which are easy to produce in various configurations and will find a very wide application in many fields of industry.

DESCRIPTION OF THE PREFERRED EMBODIMENTS

In the following description, a fluoroelastomer base copolymer used in the present invention (for mixing with a vinylidene fluoride base resin) will be called a copolymer (A) for the sake of simplicity. As mentioned hereinbefore, a suitable copolymer (A) can be prepared by either graft copolymerization or block copolymerization. In the case of graft copolymerization an exemplary process is as follows.

The first step is the preparation of a fluoroelastomer having a glass transition temperature $T_g$ below room temperature. In copolymerizing suitable monomers into such a fluoroelastomer, at least one kind of unsaturated peroxy ester (unsaturated ester having peroxy bonds) is added to the monomers to thereby obtain a fluoroelastomer having peroxy bonds. Next, VDF or a VDF-containing monomer mixture is copolymerized with the fluoroelastomer to obtain a grafted copolymer (A). In this process, radicals produced by the decomposition of the peroxy bonds in the fluoroelastomer contribute largely to the grafting of VDF to the fluoroelastomer molecules. When such radicals are produced at the terminals of the fluoroelastomer, block copolymerization will take place without spoiling the usefulness of the resultant copolymer (A) in the present invention.

In the case of preparing a copolymer (A) by block copolymerization an exemplary process is as follows.

In copolymerizing suitable monomers into a fluoroelastomer as the first step of the process, a suitable organic peroxide such as a polymeric peroxide of diacyl type having ester bonds expressed by

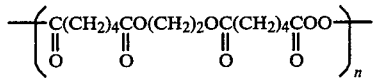

or cyclohexanone peroxide

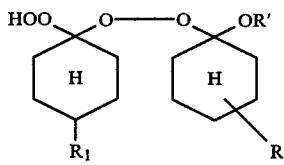

($R_1$ and $R_2$ are hydrogen, methyl group or ethyl group, respectively;

$R'$ is hydrogen or hydroxy group.)
is added to the monomer to thereby obtain a fluoroelastomer having peroxy bonds. Alternatively, a suitable organic iodide such as terminal-iodized poly(carbon difluoride) $I(CF_2)_nI$ is added to the monomers to thereby obtain a fluoroelastomer having iodine atoms at the terminals.

A copolymer (A) prepared in the above described manner is mixed with a vinylidene fluoride base resin in a desired proportion within the specified range to obtain a resin composition. Then the resin composition is shaped into the form of sheet or film. The mixing and shaping operations are performed by well known methods. Though not limitative, either a melting method or a dissolving method is convenient to carry out the mixing and shaping operations successively.

In the case of a melting method, the copolymer (A) and the vinylidene fluoride base resin are mixed and kneaded at an adequately elevated temperature by means of a suitable machine such as rolls, kneader or Bambury mixer to obtain a softened resin composition in which the two essential ingredients are uniformly dispersed. The kneading temperature is made close to a higher one of the melting temperature of the copolymer (A) and the melting temperature of the vinylidene fluoride base resin. Then the kneaded resin composition is shaped into a sheet or a film of desired dimensions by using a suitable plastics shaping machine such as an extruder having a T-die or an inflation die or a press.

In the case of a dissolving method, the copolymer (A) and the vinylidene fluoride base resin are put into a suitable polar solvent such as dimethylformamide or dimethyl sulfoxide and mixed in a dissolved or swelled state by using a stirrer to obtain a solution having a suitable viscosity. This solution is spread in a mold or on a substrate to form a liquid layer of a predetermined thickness, and the liquid layer is left standing until complete evaporation of the solvent. Thus a resin composition sheet or film of an intended thickness can be obtained.

Next, a desirably shaped sheet or film of the resin composition is stretched to an adequate extent. Any method may be employed for the stretching, but it is preferable to employ either of the following two methods with a view to enhancing the piezoelectric modulus of the final product.

A preferred stretching method utilizes a conventional zone-drawing apparatus. The resin composition sheet or film introduced into the zone-drawing apparatus is stretched while passing through a heating section located in the middle of the apparatus and successively subjected to rapid cooling in the cooling section located at the aft-end of the apparatus. At the stretching stage the sheet or film is heated to a temperature sufficiently high but lower than the melting temperatures of the ingredients of the resin composition. At the cooling stage the sheet or film is rapidly cooled to a temperature below the glass transition temperature of the resin composition.

In the case of another preferred stretching method, the resin composition sheet or film is maintained at a temperature higher than the glass transition temperature of the resin composition by at least 10° C. but not higher than room temperature. At the start of stretching the sheet or film is heated only in an end portion thereof to a temperature about 10°–100° C. below the melting temperatures of the materials of the resin composition, and gradual stretching is carried out while the remaining portions of the sheet or film are heated successively. The stretched sheet or film is cooled to a temperature below the glass transition temperature of the resin composition.

As to the extent of stretching, it is desirable that the length of the stretched sheet or film reaches at least 200% of the initial length from the viewpoint of enhancing piezoelectric modulus of the final product. A practical extent of stretching depends on various factors such as the physical state of the sheet or film, heating temperature, cooling temperature and the magnitude of the pulling force applied to the sheet or film for stretching. In other words, adequate and more than 200% stretching can be accomplished by suitably controlling these factors.

To make the stretched sheet or film an electret that serves as a piezoelectric material, the stretched sheet or film is polarized. As a usual way a polarization treatment is made on the sufficiently stretched sheet or film while the sheet or film is held stationary, by using a suitable jig if necessary. It is also possible to make a polarization treatment while the resin composition sheet or film is undergoing stretching, but the former way is preferable from the viewpoint of affording higher modulus of piezoelectricity to the treated sheets or films.

For this purpose either a thermal polarization method or a corona discharge method is available, but the latter method is preferable because of the possibility of obtaining higher moduli of piezoelectricity by this polarization method.

When a currently prevailing thermal polarization method is employed in the present invention, the stretched sheet or film is treated in the following manner. Preparatorily, metal films to serve as a pair of electrodes are closely applied to the front and back sides of the stretched sheet or film. After that the sheet or film is heated in a constant temperature oven until the temperature reaches a predetermined level. Then a DC voltage is applied for a predetermined period of time to the aforementioned electrodes in order to produce a DC electric field in the sheet or film interposing between the electrodes. After that cooling of the sheet or film is commenced, while the application of the DC voltage is continued until the sheet or film cools down to a predetermined temperature which may be room temperature or below.

When a corona discharge method is employed in the present invention, a general procedure is as follows. If need is felt, the front and back sides of the stretched sheet or film are subjected to a preliminary high frequency corona discharge treatment. Then metal films to serve as a pair of electrodes are closely applied to the front and back sides of the sheet or film. After that the sheet or film is interposed between a pair of electrodes for corona discharge and heated up to a predetermined temperature. Then a corona discharge is created across the stretched and heated sheet or film for a predetermined period of time. Upon completion of the corona discharge treatment the treated sheet or film is cooled to room temperature or below.

The temperature at which the polarization treatment is carried out may range from room temperature to the melting temperature of the material of the sheet or film, but in a more practical sense with consideration of possible thermal deformation of the sheet or film, it is preferred that the polarization treatment temperature is above room temperature but at least 10° C. below the lower one of the melting temperatures of the vinylidene fluoride resin and the copolymer (A) used as the materials of the sheet or film subjected to the treatment.

As to the applied voltage the upper limit is determined by the dielectric strength of the resin composition as the material of the sheet or film. In the case of a thermal polarization method it is preferred to apply such a voltage as produces an electric field intensity in the range from 10 to 1500 KV/cm, and in the case of a corona discharge method it is preferred to apply a voltage of 1–20 KV. The duration of the application of the voltage is not particularly limited, though generally desirable to be at least 1 min. In the case of a thermal polarization method it is preferred to maintain the electric field for at least 30 min, and in the case of a corona discharge method it is preferred to continue the corona discharge for at least 3 min.

To form a pair of electrode layers on the front and back sides of the sheet or film, use can be made of any one of known various methods such as vacuum deposition, chemical plating, metallizing, application of a conductive paste, adhesion of metal foil or metal sheet, and so on.

The invention is further illustrated by the following examples which are by no means limitative of the invention in any sense.

EXAMPLE 1

First a fluoroelastomer was prepared to use it as a raw material. Initially, 1000 g of purified water, 2 g of potassium persulfate, 3 g of ammonium perfluorooctanoate and 2 g of t-butyl peroxyallylcarbonate were charged in a 20-liter stainless steel autoclave for pressures up to 100 atm. After exhausting the autoclave of the gas atmosphere, 250 g of vinylidene fluoride (VDF) monomer and 151 g of chlorotrifluoroethylene (CTFE) monomer were introduced into the autoclave. The resultant mixture was subjected to polymerization reaction at 50° C. for 20 hr with continuous stirring. The product of the reaction had the appearance of white latex, and by a salting-out treatment it turned into a rubber-like powder. The powder was washed with water, dried in vacuum, then washed with n-hexane to completely remove unreacted residue of t-butyl peroxyallylcarbonate and again dried in vacuum. Obtained as the result was 320 g of a rubber-like copolymer in the form of white powder.

A characteristic curve obtained by thermal analysis of this copolymer using a differential scanning calorimeter (DSC) exhibited an exothermic peak at 160°–180° C., and the peak was judged to be attributed to the decomposition of peroxy bonds. By DSC analysis at low temperatures the glass transition temperature $T_g$ of the copolymer was determined to be $-21°$ C. By iodometric titration, the content of active oxygen in the copolymer was measured to be 0.042%.

For copolymerization of VDF and the fluoroelastomer prepared as described above, 120 g of the rubber-like copolymer powder and 750 g of Freon R-113 (1,1,2-trichloro-1,2,2-trifluoroethane) were charged into a 1-liter stainless steel autoclave for pressures up to 20 atm, and, after exhausting the autoclave of the gas atmosphere, 60 g of VDF monomer was introduced into the autoclave. The resultant mixture was subjected to graft copolymerization reaction at 95° C. for 24 hr. A copolymer formed by the reaction was separated from the liquid medium and dried to obtain 164.6 g of white powder. This copolymer will be referred to as FEC-1. The copolymer FEC-1 was confirmed to be insoluble in acetone (50° C.) which serves as a solvent for the fluoroelastomer used as the raw material and dimethylformamide (70° C.) which is a good solvent for poly(vinylidene fluoride) (PVDF). The melting temperature of the copolymer FEC-1 was 155°–160° C.

To prepare a piezoelectric material according to the invention, 10 g of the copolymer FEC-1 was mixed with 100 g of PVDF (SOLEF 1010 of Solvay Co., homopolymer of VDF), and the mixture was kneaded by means of rolls kept heated at 200° C. The kneaded mixture was press-shaped at 220° C. into an about 100 μm thick film. The melting temperature (peak temperature by DSC analysis) of the film was 170° C. The film was heated to 80° C. and stretched unidirectionally to obtain a 250% stretched film. Electrode layers were formed on the front and back sides of the stretched film by vacuum deposition of gold, and then the stretched film was polarized at a temperature of 100° C. by applying a DC electric field of 500 KV/cm for 30 min. The piezoelectric polymer film obtained by this process was subjected to measurement of the piezoelectric modulus $d_{31}$ at 25° C. using a rheolograph. The result is shown in the following Table 1 together with the corresponding data obtained on other piezoelectric materials prepared in the following examples and comparative experiments.

EXAMPLES 2-5

As Examples 2-5, four kinds of piezoelectric materials according to the invention in the form of film were produced almost similarly to the film of Example 1 but by varying the amount of the copolyer FEC-1 mixed with 100 g of PVDF to 30 g, to 50 g, to 70 g and to 90 g in the respective examples.

COMPARATIVE EXPERIMENT 1

A piezoelectric polymer film was produced generally similarly to the film of Example 1 but by increasing the amount of the copolymer FEC-1 mixed with 100 g of PVDF to 120 g.

COMPARATIVE EXPERIMENT 2

In this case PVDF (SOLEF 1010) alone was press-shaped at 220° C. into an about 100 μm thick film, and the PVDF film was stretched at 80° C. to obtain a 250% stretched film. Electrode layers of gold were provided to the stretched film, and polarization of the stretched film was carried out by application of the DC electric field described in Example 1 for 30 min at 100° C.

EXAMPLE 6

The rubber-like copolymer FEC-1 described in Example 1 and VDF were copolymerized by the same method and under the same reaction conditions as in Example 1, but in this example the quanity of FEC-1 was decreased to 50 g and the quantity of VDF was increased to 120 g. The quantity of Freon R-113 was 250 g. Obtained as the result was a copolymer in the form of white powder which weighed 160.4 g. This copolymer will be referred to as FEC-6. The copolymer FEC-6 was insoluble in acetone (50° C.) and dimethylformamide (70° C.).

To produce a piezoelectric film according to the invention, 10 g of the copolymer FEC-6 was mixed with 100 g of PVDF (SOLEF 1010). The mixture was roll-kneaded and press-shaped into an about 100 μm thick film under the same process conditions as in Example 1, and the film was stretched unidirectionally at 80° C. to obtain a 250% stretched film. After vacuum deposition of gold to form electrode layers, the stretched film was subjected to the same DC electric field treatment as in Example 1.

EXAMPLES 7 and 8

These two examples were generally identical with Example 6, but the amount of the copolymer FEC-6 mixed with 100 g of PVDF was increased to 50 g in Example 7 and to 70 g in Example 8.

COMPARATIVE EXPERIMENT 3

A piezoelectric polymer film was produced generally in accordance with Example 6 but by increasing the amount of the copolymer FEC-6 mixed with 100 g of PVDF to 120 g.

COMPARATIVE EXPERIMENT 4

A copolymer of VDF and CTFE was prepared by the same process as in the first step in Example 1 except that t-butyl peroxyallylcarbonate was not used in this experiment.

Using a mixture of 10 g of the obtained VDF-CTFE copolymer and 100 g of PVDF, a piezoelectric film was produced by the same process as in Example 1.

EXAMPLE 9

The processes of Example 1 were repeated as far as the deposition of the gold electrode layers on the stretched film. In this case the stretched film was kept fixedly held at two opposite ends thereof and heated to 100° C., and in this state the stretched film was subjected to a DC current corona discharge treatment, in which the voltage across the positive and negative terminals of the DC power source was 12 KV and which was continued for 15 min.

EXAMPLE 10

The processes of Example 1 were repeated as far as the press-shaping of the polymer mixture into the about 100 μm thick film.

In a constant temperature oven maintained at 80° C., the film before stretching was clamped at two opposite ends thereof and held between a pair of needle-shaped electrodes used to create a corona discharge. While a stretching force was applied to the film at one or both of the clamped ends by using a stretching machine to stretch the film at a rate of 20%/min, a corona discharge was created between the electrodes by applying a DC voltage of 12 KV across the electrodes. The distance of the film from either of the positive and negative electrodes was 10 mm. The corona discharge treatment was continued until the stretching of the film reached 250%. After that the treated film was formed with gold electrode layers and subjected to the measurement of the piezoelectric modulus $d_{31}$.

EXAMPLE 11

The processes of Example 1 were repeated as far as the stretching of the press-shaped film. The stretched film was kept fixedly held at two opposite ends thereof and heated to 80° C., and in this state the film was subjected to a DC current corona discharge treatment, in which the voltage across the positive and negative electrodes was 12 KV and which was continued for 12 min. After that the treated film was formed with gold electrode layers and subjected to the measurement of the piezoelectric modulus.

TABLE 1

| | Ingredients of Piezoelectric Material (parts by wt.) | | Piezoelectric Modulus $d_{31}$ of Stretched and Polarized Film (at 25° C.) |
|---|---|---|---|
| | PVDF | Copolymer | (cgs-esu) |
| Ex. 1 | 100 | FEC-1 10 | $10.5 \times 10^{-7}$ |
| Ex. 2 | 100 | " 30 | $10.2 \times 10^{-7}$ |
| Ex. 3 | 100 | " 50 | $10.2 \times 10^{-7}$ |
| Ex. 4 | 100 | " 70 | $9.40 \times 10^{-7}$ |
| Ex. 5 | 100 | " 90 | $7.80 \times 10^{-7}$ |
| Comp. Exp. 1 | 100 | FEC-1 120 | $5.02 \times 10^{-7}$ |
| Comp. Exp. 2 | 100 | — | $4.86 \times 10^{-7}$ |
| Ex. 6 | 100 | FEC-6 10 | $10.3 \times 10^{-7}$ |

TABLE 1-continued

|  | Ingredients of Piezoelectric Material (parts by wt.) |  | Piezoelectric Modulus $d_{31}$ of Stretched and Polarized Film (at 25° C.) |
| --- | --- | --- | --- |
|  | PVDF | Copolymer | (cgs-esu) |
| Ex. 7 | 100 | " | 50 | $10.0 \times 10^{-7}$ |
| Ex. 8 | 100 | " | 70 | $9.80 \times 10^{-7}$ |
| Comp. Exp. 3 | 100 | FEC-6 | 120 | $5.06 \times 10^{-7}$ |
| Comp. Exp. 4 | 100 | VDF-CTFE | 10 | $3.41 \times 10^{-7}$ |
| Ex. 9 | 100 | FEC-1 | 10 | $14.3 \times 10^{-7}$ |
| Ex. 10 | 100 | FEC-1 | 10 | $11.4 \times 10^{-7}$ |
| Ex. 11 | 100 | FEC-1 | 10 | $12.2 \times 10^{-7}$ |

EXAMPLE 12

Initially, 300 g of purified water, 0.6 g of potassium persulfate, 1 g of ammonium perfluorooctanoate and 1 g of t-butyl peroxyallylcarbonate were charged in a 100 ml stainless steel autoclave for pressures up to 100 atm. After exhausting the autoclave of the gas atmosphere, 67.2 g of VDF monomer and 52.8 g of hexafluoropropylene (HFP) monomer were introduced into the autoclave. The resultant mixture was subjected to polymerization reaction at 55° C. for 17 hr with continuous stirring. The product of the reaction was a white powdery copolymer, which was separated from the liquid medium, washed first with water and then with methanol and dried. Obtained as the result was 83.5 g of a rubber-like copolymer. By DSC analysis the glass transition temperature $T_g$ of this copolymer was $-19°$ C., and by iodometric titration the content of active oxygen in the copolymer was measured to be 0.063%.

For copolymerization of VDF and the fluoroelastomer prepared as described above, 60 g of the rubber-like copolymer and 375 g of Freon R-113 were charged in a 500 ml stainless steel autoclave for pressures up to 100 atm, and, after exhausting the autoclave of the gas atmosphere, 40 g of VDF monomer was introduced into the autoclave. The resultant mixture was subjected to graft copolymerization reaction at 95° C. for 24 hr. The product of the reaction was a white powdery copolymer which weighed 81 g after drying. This copolymer will be referred to as FEC-12. The copolymer FEC-12 was insoluble in acetone (50° C.) and dimethylformamide (70° C.).

To produce a piezoelectric film according to the invention, 10 g of the copolymer FEC-12 was mixed with 100 g of PVDF (SOLEF 1010). The mixture was roll-kneaded and press-shaped into an about 100 μm thick film under the same process conditions as in Example 1, and the film was unidirectionally stretched at 80° C. to obtain a 250% stretched film. After vacuum deposition of gold electrode layers, the stretched film was polarized at a temperature of 100° C. by applying a DC electric field of 500 KV/cm for 30 min. The piezoelectric modulus $d_{31}$ measured on this film is shown in Table 2 together with the corresponding data obtained on other piezoelectric materials produced in the following examples and comparative experiments.

EXAMPLES 13 and 14

These two examples were generally identical with Example 12, but the amount of the copolymer FEC-12 mixed with 100 g of PVDF was increased to 50 g in Example 13 and to 70 g in Example 14.

COMPARATIVE EXPERIMENT 5

A piezoelectric film was produced generally similarly to the film of Example 12 but by increasing the amount of the copolymer FEC-12 mixed with 100 g of PVDF to 120 g.

COMPARATIVE EXPERIMENT 6

Using a mixture of 10 g of the VDF-HFP copolymer prepared in Example 12 and 100 g of PVDF, a piezoelectric film was produced by the same process as in Example 12.

EXAMPLE 15

Initially, 1000 g of purified water, 4 g of 1,1'-dihydroperoxy-1,1'-dicyclohexyl peroxide, 0.8 g of sodium thiosulfate and 3 g of ammonium perfluorooctanoate were charged in a 2-liter stainless steel autoclave for pressures up to 100 atm. After exhausting the autoclave of the gas atmosphere, 250 g of VDF monomer and 146 g of CTFE monomer were introduced into the autoclave. The resultant mixture was subjected to polymerization reaction at 55° C. for 20 hr with continuous stirring. Then unreacted portions of VDF monomer and CTFE monomer were discharged from the reaction system. After that VDF monomer was introduced into the autoclave containing the product of the initial polymerization reaction until the pressure in the autoclave reached 20 atm. To carry out block polymerization reaction, the autoclave was maintained at 95° C. for 24 hr while VDF monomer was continuously added so as to maintain the pressure of 20 atm in the autoclave. The product of the reaction had the appearance of latex, and a salting-out treatment of the latex gave a powdery copolymer. After washing and thorough drying the copolymer weighed 220 g. This copolymer will be referred to as FEC-15.

To produce a piezoelectric film according to the invention, 10 g of the copolymer FEC-15 was mixed with 100 g of PVDF (SOLEF 1010). The mixture was roll-kneaded and press-shaped into an about 100 μm thick film under the same process conditions as in Example 1, and the film was unidirectionally stretched at 80° C. to obtain a 250% stretched film. After vacuum deposition of gold electrode layers, the stretched film was polarized at a temperature of 100° C. by applying a DC electric field of 500 KV/cm for 30 min.

Example 16

A piezoelectric film was produced generally in accordance with Example 15 except that the amount of the copolymer FEC-15 mixed with 100 g of PVDF was increased to 30 g.

TABLE 2

|  | Ingredients of Piezoelectric Material (parts by wt.) |  | Piezoelectric Modulus $d_{31}$ of Stretched and Polarized Film (at 25° C.) |
| --- | --- | --- | --- |
|  | PVDF | Copolymer | (cgs-esu) |
| Ex. 12 | 100 | FEC-12 | 10 | $10.6 \times 10^{-7}$ |
| Ex. 13 | 100 | " | 50 | $10.2 \times 10^{-7}$ |
| Ex. 14 | 100 | " | 70 | $10.0 \times 10^{-7}$ |
| Comp. Exp. 5 | 100 | FEC-12 | 120 | $5.13 \times 10^{-7}$ |
| Comp. Exp. 6 | 100 | VDF-HFP | 10 | $2.72 \times 10^{-7}$ |
| Ex. 15 | 100 | FEC-15 | 10 | $11.0 \times 10^{-7}$ |
| Ex. 16 | 100 | " | 30 | $10.5 \times 10^{-7}$ |

What is claimed is:

1. A piezoelectric polymeric material which is the product of a process comprising the steps of
   (1) providing a sheet or film comprising a mixture of
      (a) 100 parts by weight of a homopolymer of vinylidene fluoride and
      (b) between 1 and 100 parts by weight of a copolymer prepared by graft copolymerizing or block copolymerizing (i) a monomer comprising at least 50% by weight of vinylidene fluoride monomer and (ii) a fluoroelastomer, such that the proportion of said vinylidene fluoride in said monomer to said fluoroelastomer is in the range from 1:100 to 100:100 by weight;
   (2) stretching said sheet or film at a temperature below the melting temperature of said mixture; and
   (3) after said stretching has commenced, polarizing said sheet or film, thereby making the stretched sheet or film an electret.

2. A piezoelectric material according to claim 1, wherein said fluoroelastomer is a copolymer selected from the group consisting of copolymers of vinylidene fluoride and hexafluoropropylene, copolymers of vinylidene fluoride, hexafluoropropylene and tetrafluoroethylene, copolymers of vinylidene fluoride and chlorotrifluoroethylene, copolymers of propylene and tetrafluoroethylene and copolymers of tetrafluoroethylene and a fluorine-containing vinyl ether.

3. A piezoelectric material according to claim 1, wherein said monomer of said copolymer is substantially entirely vinylidene fluoride monomer.

4. A piezoelectric material according to claim 1, wherein said mixture consists essentially of 100 parts by weight of said homopolymer and 1–70 parts by weight of said copolymer.

5. A piezoelectric material according to claim 1, wherein said step (2) comprises stretching said sheet or film from an initial length to a length which is at least 200% of said initial length.

6. A piezoelectric polymeric material which is the product of a process comprising the steps of
   (1) providing a sheet or film comprising a mixture of
      (a) 100 parts by weight of a first copolymer comprised of (i) more than 50% by weight of vinylidene fluoride monomer and (ii) at least one different fluorine-containing monomer selected from the group consisting of vinyl fluoride, trifluoroethylene, tetrafluoroethylene, hexafluoropropylene and hexafluorobutene and
      (b) between 1 and 100 parts by weight of a second copolymer prepared by graft copolymerizing or block copolymerizing a monomer comprising (i) at least 50% by weight of vinylidene fluoride monomer and (ii) a fluoroelastomer, such that the proportion of said vinylidene fluoride in said monomer to said fluoroelastomer is in the range from 1:100 to 100:100 by weight;
   (2) stretching said sheet or film at a temperature below the melting temperature of said mixture; and
   (3) after said stretching has commenced, polarizing said sheet or film, thereby making the stretched sheet or film an electret.

7. A piezoelectric material according to claim 6, wherein said fluoroelastomer is a copolymer selected from the group consisting of copolymers of vinylidene fluoride and hexafluoropropylene, copolymers of vinylidene fluoride, hexafluoropropylene and tetrafluoroethylene, copolymers of vinylidene fluoride and chlorotrifluoroethylene, copolymers of propylene and tetrafluoroethylene and copolymers of tetrafluoroethylene and a fluorine-containing vinyl ether.

8. A piezoelectric material according to claim 1, wherein said monomer of said second copolymer is substantially entirely vinylidene fluoride monomer.

9. A piezoelectric material according to claim 6, wherein said mixture consists essentially of 100 parts by weight of said first copolymer and 1–70 parts by weight of said second copolymer.

10. A piezoelectric material according to claim 6, wherein said step (2) comprises stretching said sheet or film from an initial length to a length which is at least 200% of said initial length.

* * * * *